May 25, 1965 B. E. SEAR 3,185,863
WAVEFORM LEVEL GATING CIRCUIT EMPLOYING A TWO TUNNEL-DIODE FLIP-FLOP CONTROLLED BY ANOTHER TWO TUNNEL-DIODE FLIP-FLOP
Filed Oct. 2, 1961 2 Sheets-Sheet 1

INVENTOR
BRIAN ELLIOTT SEAR
BY J. Donald Weber, Jr.
AGENT 3,185,863

WAVEFORM LEVEL GATING CIRCUIT EMPLOYING A TWO TUNNEL-DIODE FLIP-FLOP CONTROLLED BY ANOTHER TWO TUNNEL-DIODE FLIP-FLOP

Brian Elliott Sear, Oreland, Pa., assignor to Sperry Rand Corporation, New York, N.Y., a corporation of Delaware Filed Oct. 2, 1961, Ser. No. 142,219
8 Claims. (Cl. 307—88.5)

The instant invention provides a waveshaping circuit which produces a first output signal for any input signal greater than a specified level and produces a different output signal for any input less than another specified level.

The circuit which is the subject of this invention operates similar to a typical Schmitt trigger and utilizes tunnel diodes for the active elements thereof. By utilizing tunnel diodes, higher speeds of operation may be provided; thus, operation at very high frequencies is possible and the rise time of the output pulses can be extremely short. By properly biasing the tunnel diode circuit, the required amplitude of the input signals can be on the order of a few millivolts. Likewise, the component tolerances (which have heretofore been extremely critical in tunnel diode circuits) may be considerably relaxed.

Basically, the circuit includes two tunnel diodes connected head to tail in order to form a flip-flop connected between two further tunnel diodes which are properly biased such that one or the other is switched by the application of an input signal. Subsequent to the application of an input signal to the switching diodes, the flip-flop diodes will be switched in accordance with the initial conditions of the system. In accordance with the condition of the flip-flop diodes, the information represented by the input signal may be stored.

Output signals may be derived at several locations throughout the circuit; however, the primary outputs are at the switching tunnel diodes as opposed to the flip-flop tunnel diodes.

In accordance with the brief introduction surpra it is clear that one object of the invention is to provide a circuit which functions similar to a Schmitt trigger circuit.

Another object of this invention is to provide a level-gating circuit which produces different output signals in response to input signals above or below specific levels.

Another object of this invention is to provide a wave-shaping network which is sensitive to input signals having amplitudes on the order of a few millivolts.

Another object of this invention is to provide a wave-shaping circuit using tunnel diodes whereby operation at very high frequencies is possible.

Another object of the invention is to provide a circuit using tunnel diodes and following principles whereby tunnel diode tolerance limits are relaxed.

These and other objects and advantages of the subject invention will become obvious with a further reading of the following description in conjunction with the attached drawings in which.

Figure 1:
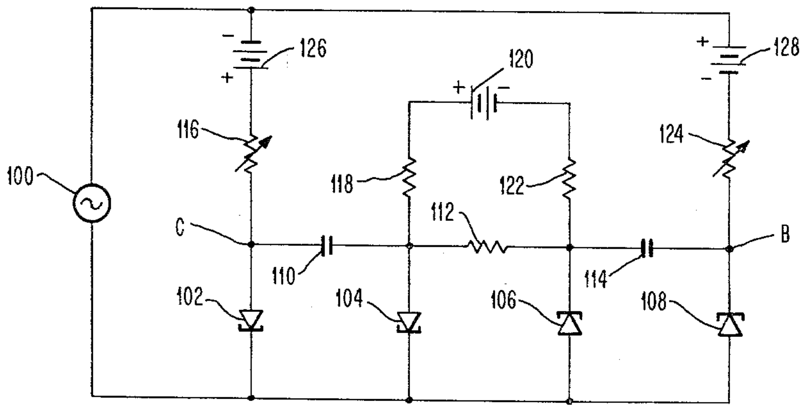
FIGURE 1 is a schematic showing of one preferred embodiment of the invention.

Referring now to FIGURE 1, there is shown a schematic drawing of one preferred circuit utilizing the principles of the invention. The input signals are supplied by input signal source 100. Source 100 may comprise any typical sinusoidal or other varying signal source. Typically, the source may operate between about D.C. and 500 megacycles per second. A first terminal of source 100 is connected to the bias sources 126 and 128 respectively. It will be seen that the bias sources which may be, for example batteries or regulated D.C. supplies are connected in aiding polarity. That is, the positive terminal of source 128 is connected to the negative terminal of source 126. Source 126 has its positive terminal connected to one terminal of impedance 116. The impedance 116 is shown as a variable impedance and is used to regulate the bias current which is supplied to switching tunnel diode 102. Typically, this impedance may be a 2000 ohm variable resistor. The anode of tunnel diode 102 is connected to another terminal of impedance 116. The cathode of tunnel diode 102 is then returned to a second terminal of source 100.

Similarly, the negative terminal of source 128 is connected to one terminal of impedance 124. Again, impedance 124 (as in the case of impedance 116) is a variable impedance and is used to control the bias current supplied to switching tunnel diode 108. Tunnel diode 108 has the cathode thereof connected to another terminal of impedance 124 and the anode thereof returned to the second terminal of source 100 along with the cathode of tunnel diode 102.

The anode of switching tunnel diode 102 is connected to one side of the capacitor 110 which has the other side thereof connected to the anode of a tunnel diode 104, which is one of the flip-flop diodes. Tunnel diode 104 has the cathode thereof returned to the second terminal of source 100 similar to the cathode of tunnel diode 102.

The other half of the flip-flop, tunnel diode 106, has the anode thereof connected to the second terminal of input source 100. The cathode of tunnel diode 106 is attached to one side of capacitor 114 which has the other side thereof connected to the cathode of tunnel diode 108.

Connected between the anode of tunnel diode 104 and the cathode of tunnel diode 106 is a bias network. This bias network comprises impedances 118 and 122 in series with source 120, all of which are connected in parallel with impedance 112. Typically, these impedances may be resistors, the values of which are: impedance 118, 2000 ohms; impedance 122, 2000 ohms; impedance 112, 30 ohms. Source 120 may be a battery or other regulated D.C. supply. The impedance values suggested are quite accurate when using, for example an RCA IN3129 20 milliampere tunnel diode. Of course, the values may be changed if different tunnel diodes are used.

Figure 1A:
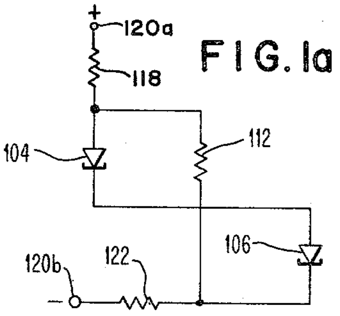
FIGURE 1A is a schematic showing of the flip-flop portion of FIGURE 1 with the components rearranged in order to provide an easier understanding.

Reference is immediately made to FIGURE 1A which is a different showing of the components which comprise the flip-flop portion of the circuit shown in FIGURE 1. Since FIGURE 1A is a mere re-showing of this portion of the circuit, similar components bear similar reference numerals. Thus, it will be seen that terminal 120a represents the positive terminal of source 120 (of FIGURE 1) to which one terminal of impedance 118 is connected. Likewise terminal 120b represents the negative side of source 120 to which is connected one terminal of impedance 122. Between other terminals of impedances 118 and 122, there is connected impedance 112 which is in parallel with tunnel diodes 104 and 106 which are connected head-to-tail. In particular, the tunnel diodes are connected so that the anode of tunnel diode 104 is connected to the other terminal of impedance 118 while the other terminal of impedance 122 is connected to the cathode of tunnel diode 106. In order to fully describe the operation of the circuit shown in FIGURE 1, reference must be made to the tunnel diode characteristics shown in FIGURE 2.

Figure 2:
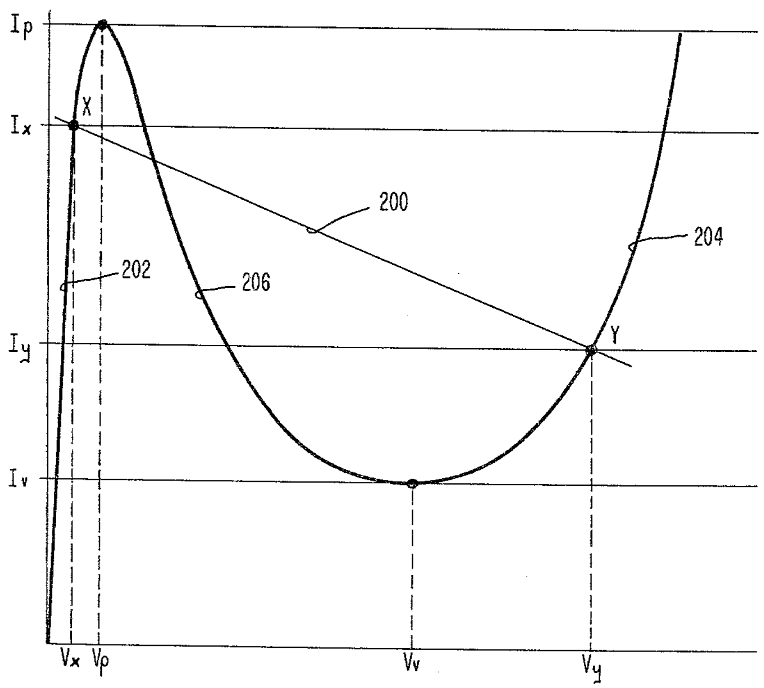
FIGURE 2 is a graphic showing of the Voltage-Current characteristic of a typical tunnel diode.

In FIGURE 2, the load line 200 crosses the characteristic curve at two different stable conditions. The two intersections represent two stable operating points or states for the tunnel diodes. In particular, the operating point X lies in the Off portion of the curve 202. Likewise, intersection Y lies on the On portion of the curve 204. Curve portion 206, which lies between the peak and valley points of the curve represents a negative-resistance, unstable portion of the tunnel diode operation. It will be seen that the slope of the load-line 200 is such that the characteristics of a tunnel diode define a substantially symmetrically operating bistable element. That is, the input signal in the positive going direction necessary to drive the tunnel diode from $I_x$ via $I_p$ to the On condition at $I_y$ has substantially the same magnitude as the signal which is required to drive the tunnel diode from the $I_y$ condition via $I_v$ through to the Off condition at $I_x$. It should be understood that this suggested method of symmetrical operation is not required but rather is described as a preferred arrangement. In fact, the characteristic need not actually be symmetrical, but may be asymmetrical with the various tunnel diodes being overdriven, as required, in order to drive the various diodes into the respective On or Off conditions.

Referring now to FIGURE 1A (or FIGURE 1) it will be assumed that initially the circuit is not active. Thus, when the circuit is initially activated, conventional current will tend to flow from the terminal 120*a* (positive terminal of source 120) to the terminal 120*b* (negative terminal of source 120) via the intervening circuitry. As in the case of typical flip-flops utilizing vacuum tubes or transistors, each of the tunnel diodes 104 and 106 will have somewhat different characteristics. Therefore, one of these diodes will switch to the On state before the other of said diodes is capable thereof. That is, the impedance 112 is substantially higher than the internal impedance of either of the tunnel diodes. Thus, the current flows through impedance 118, tunnel diode 104, tunnel diode 106 and impedance 122. The current is predetermined to be sufficient to switch one of the tunnel diodes from the Off condition to the On condition. However, this current is not sufficient to turn both of the tunnel diodes from the Off condition to the On condition simultaneously. Thus, it is assumed that tunnel diode 104 is the tunnel diode which initially switches. Consequently, in view of the limitations predescribed, the tunnel diode 106 cannot switch from the Off to the On condition. The flip-flop will then tend to sustain itself in the condition which it assumes. This may be seen by noting that when a tunnel diode flips to its On condition, there is a voltage drop thereacross on the order of 500 or 600 millivolts. At the same time, the tunnel diode which is not switched to the On condition, but on the contrary resides in the Off condition, produces approximately a 50 millivolt drop thereacross. Thus, it will be seen that impedance 112 which is coupled between the anode of diode 104 and the cathode of tunnel diode 106 effectively provides a path whereby the 500 or 600 millivolt potential at the anode of tunnel diode 104 is transferred to the cathode of the tunnel diode 106. (Of course, the 500 millivolt potential at the anode of diode 104 is diminished by the voltage drop across impedance 112). In view of the fact that a 50 millivolt potential drop exists across tunnel diode 106 it will be seen that the cathode of diode 106 is at approximately +500 to +600 millivolts while the anode of the diode 106 is in the neighborhood of +50 millivolts. Consequently it is clear that tunnel diode 106 is biased Off. It should be clear that if the tunnel diode operation was reversed so that tunnel diode 104 was kept in the Off condition and tunnel diode 106 was switched On that the low voltage at the cathode of tunnel diode 106 would be fed back to the anode of tunnel diode 104 via resistance 112 and the high voltage level at the anode of tunnel diode 106 would be fed back to the cathode of tunnel diode 104 thereby biasing that diode Off.

Referring now to FIGURE 1, it will be seen that at the initiation of operation of the circuit tunnel diode 104 is biased to the On condition and tunnel diode 106 is biased to the Off condition. It will be seen that the flip-flop which comprises tunnel diodes 104 and 106 actually operates as a memory network for the overall circuit. The initial conditions of the tunnel diodes 104 and 106 are not important to the operation of the circuit. However, it will be seen that these tunnel diodes do in fact perform a very valuable function in the operation of the circuit.

In FIGURE 1, the biasing networks associated with each of the switching tunnel diodes 102 and 108 are such that these tunnel diodes are biased to the peak point and valley point respectively with the application of no input signal. That is, the current supplied by source 126 and impedance 116 causes diode 102 to reside at the peak point represented by bias current $I_p$. Likewise, the source 128 and impedance 124 cause the tunnel diode 108 to be biased to the valley point represented by bias current $I_v$. It will be clear that the application of a positive signal (greater than zero in magnitude) by source 100 causes tunnel diode 102 to switch from the Off state to the On state. This same positive signal will drive tunnel diode 108 into the Off state. The application of a negative signal (less than zero in magnitude) will of course drive tunnel diode 102 into the Off condition and will switch tunnel diode 108 from the Off condition to the On condition. Therefore, source 100 may supply a sinusoidally varying (or similar) signal having both polarity signals.

The circuit will, therefore, operate as a Schmitt trigger and be sensitive to the level of the input signal for switching. That is, it is assumed that an input signal supplied by source 100 is approaching the zero magnitude (see FIGURE 3A) from the negative direction. As the signal increases in magnitude, the load line 200 of FIGURE 2 moves up along the characteristic curve. In particular, it is assumed that tunnel diode 102 is initially biased Off and the load line intersection moves along curve portion 202 toward the peak point on the characteristic curve. When the input signal reaches zero magnitude, the operating point of the tunnel diode 102 is at the peak point. As the input signal increases into the positive portion of the cycle the tunnel diode operating point exceeds the peak point and diode 102 is switched to the On condition. The operating point thereof is represented by point Y which is the intersection of load line 200 and the On portion 204 of the characteristic curve. Thus, tunnel diode 102 is turned On. When tunnel diode 102 is in the On condition, a potential drop of about 500 millivolts is produced thereacross. Thus, the anode of tunnel diode 102 is at approximately the +500 millivolt level. This +500 millivolt potential is applied to capacitor 110. In view of the fact that this is a rapidly changing signal, the signal is passed across the capacitor and is applied to the anode of tunnel diode 104. In view of the fact that tunnel diode 104 was initially assumed to be On, there will be no change in the operation of this tunnel diode. However, if tunnel diode 104 had initially been in the Off condition, the application of the +500 millivolt signal to the anode thereof would have caused tunnel diode 104 to switch to the On state.

As previously discussed, substantially all of the +500 millivolt signal at the anode of tunnel diode 104 is impressed upon the cathode of tunnel diode 106 whereby tunnel diode 106 is either cut off or maintained in the Off condition. Of course, in the assumed conditions, this latter situation exists and tunnel diode 106 remains in the Off condition. Likewise, the +500 millivolt signal is passed by capacitor 114 to the cathode of tunnel diode 108 whereby tunnel diode 108 is either turned Off or maintained in the Off condition. Moreover, the positive potential applied to the cathode of tunnel diode 108 by source 100 is operative to effectively reverse bias the tunnel diode.

It will be clear that the operation previously described is produced while the input signal is in the positive portion of its cycle. Furthermore, in view of the extremely fast switching tunnel diodes it will be understood that this operation may take place in an extremely short portion of the positive cycle of the input signal.

If it is assumed that the input signal cycle continues and approaches now the zero magnitude level from the positive side, the load-line 200 in FIGURE 2 will move such that the operating point for tunnel diode 102 moves down along the curve portion 204 of the characteristic curve. Conversely, the operating point for tunnel diode 108 will move up along the curve portion 202 of the characteristic curve. Thus, when the input voltage signal reaches zero from the positive direction, tunnel diode 108 is biased to the peak point represented by bias current $I_p$ so that tunnel diode 108 can be switched from the Off state by a negative potential input signal at the cathode thereof into the On state. The low level potential which exists at the cathode of tunnel diode 108 when it is switched On is transferred to the cathode of tunnel diode 106 via capacitor 114. Because the anodes of these two tunnel diodes are coupled together and have a high level potential thereon, it will be clear that tunnel diode 106 is similarly turned On. Again, the potential at the cathode of tunnel diode 106 is transferred to the anode of tunnel diode 104 by impedance 112. Inasmuch as the potential applied to the anode of tunnel diode 104 is a low level potential value, tunnel diode 104 is substantially reverse-biased and therefore, switched from its previous On condition to the Off condition. Likewise, the low level potential of the anode of diode 104 is passed to the anode of diode 102 via capacitor 110 whereby diode 102 is similarly switched to the Off condition. Again, the negative potential supplied by source 100 is effective to substantially reverse-bias tunnel diode 102.

It will be seen that each of the conditions of the overall circuit as described previously for the various conditions of the input signal are stable conditions. Thus, in the event that the input signal was in the nature of a step pulse the circuit could be switched to one condition and caused to remain therein until a further step signal was applied in the opposite direction thereby switching the circuit to the other of its stable conditions.

Figure 3:
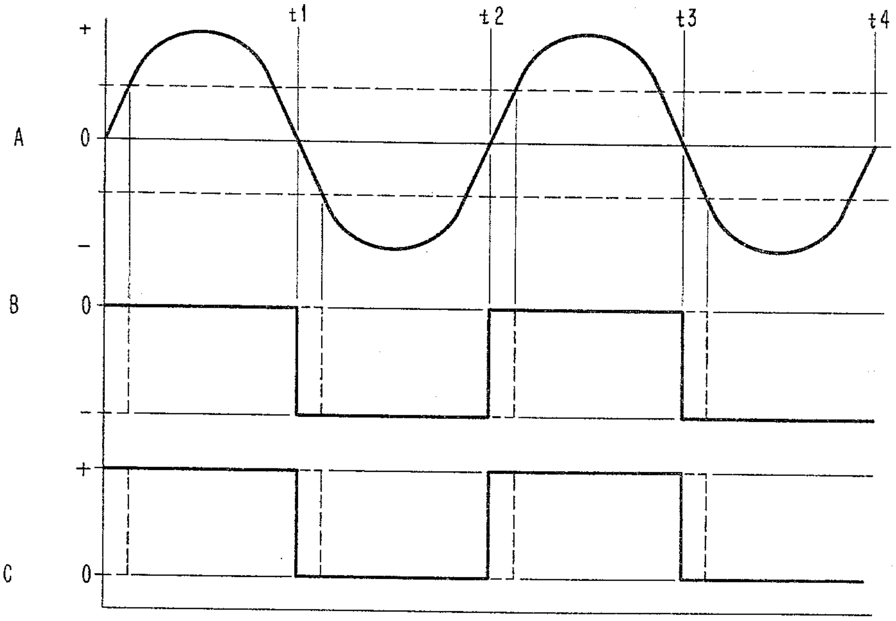
FIGURE 3 is a graphic showing of the input and output waveforms.

Referring now to FIGURE 3, there are shown graphically exemplary waveforms for the input and output signals. In particular the input signal is shown as a sinusoidal signal. The output signal as shown in FIGURE 3B is the signal which is derived at the cathode of tunnel diode 108 in FIGURE 1. The signal shown in FIGURE 3C is an output signal which is obtained at the anode of tunnel diode 102 in FIGURE 1. Thus, in accordance with the operation of the circuit as previously described, as the input signal crosses the zero axis in either direction the circuit is switched from one condition to the other. Thus, for example at time period T1, the input signal crosses the zero axis from the positive to the negative direction. At this time it will be seen that the output signal produced at the cathode of tunnel diode 108 and shown in FIGURE 3B changes from its low magnitude to its high magnitude; similarly, the output signal produced at the anode of tunnel diode 102 and shown in FIGURE 3C switches from its high magnitude to its low magnitude.

The above description defines the circuit and the operation thereof in a preferred embodiment. It should be clear that this description is not limitative of the invention but is merely a preferred embodiment. Other modifications to this circuit may be made which will alter somewhat the operation thereof in accordance with the individual requirements of the circuit utilizer. For example, the input signal need not be symmetrical about zero, or the bias circuits associated with the tunnel diodes 102 and 108 need not be designed to cause a switching of these diodes with the crossing of the zero axis by the input signal. For example the bias networks may bias the respective tunnel diodes to operating points other than the peak and valley points such that the input signal may, in fact, be greater than or less than the magnitude zero when switching occurs. This type of operation is suggested by the dashed lines in 3A through C and permits switching within a potential range defined by the bias potentials.

Figure 4A:
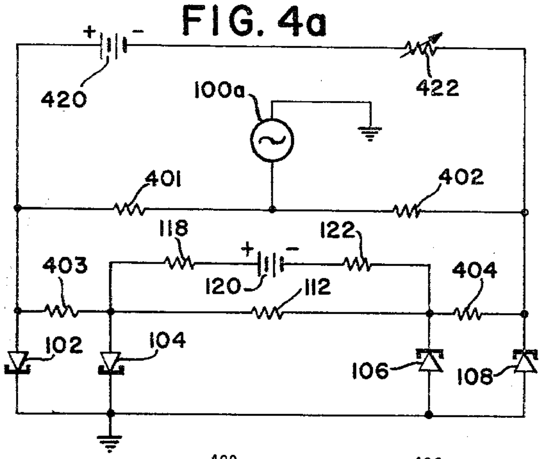
FIGURES 4 and 4A are schematic showings of other embodiments of the instant invention.
Figure 4:
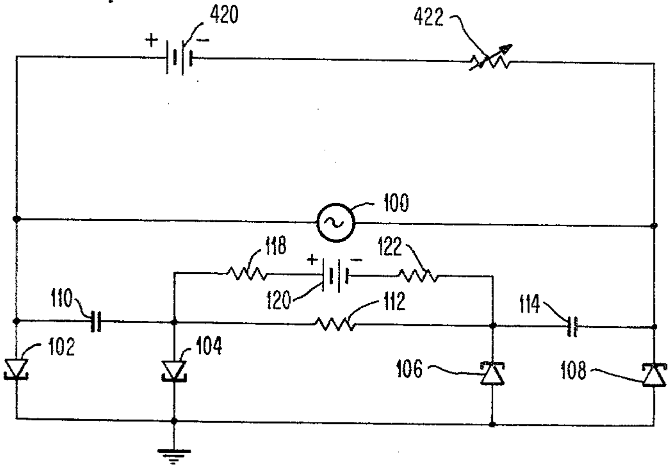

Referring now to FIGURE 4, there is shown another embodiment of this invention. FIGURE 4 is a schematic showing of the circuit which is substantially similar to that shown in FIGURE 1. Consequently, similar components bear similar reference numerals. It will be noted, however, that in FIGURE 4 the input source 100 is connected in parallel with a single bias network. Moreover, the bias source comprises a single battery 420 and a single variable impedance 422. The single bias source 420 replaces bias sources 126 and 128 and the single impedance 422 replaces impedances 116 and 124. It will be seen, of course, that this type of construction permits a savings in the number of components utilized and also presents a current sensitive circuit instead of a voltage sensitive circuit. Actually, however, the operation of the circuit shown in FIGURE 4 is substantially identical to the operation of the circuit shown in FIGURE 1 and a further description thereof is unnecessary.

By incorporating a further modification, the circuit can be made voltage sensitive while still requiring fewer components. This modification is shown in FIGURE 4A. Thus, the source 100 may be replaced by source 100*a* which is coupled between a particular reference level, for instance ground, and the junction of the pair of resistors 401 and 402. The resistors 401 and 402 are connected in series bewteen the anode of tunnel diode 102 and the cathode of tunnel diode 108. It will be seen that this input arrangement is advantageous in that the bias sources need not be floating and the system will be tied more accurately to a definite reference point.

The circuits shown in FIGURES 4 and 4A are other embodiments of the invention and are more useful where the system hysteresis is not problematical. By system hysteresis, of course, is meant that the circuit is turned on by a current (or voltage) of a certain level and turned off by a current (or voltage) of a substantially different level. This type of operation may in fact be preferred in some cases whereby the circuits shown in FIGURES 4 and 4A are more desirable than the circuit shown in FIGURE 1 which has substantially zero system hysteresis. By "substantially zero hysteresis" is meant that when coupling capacitors, for example capacitors 110 and 114, are used, as shown, there will be a minimum system hysteresis due to circuit noise. That is, the bias levels would have to be set to $0+\Delta V$ and $0-\Delta V$ in order that noise would not trigger the circuit and produce relaxation oscillation. The minimum hysteresis would therefore be $2\Delta V$ and would depend upon the tolerance allowances as well as the noise figure.

By using coupling resistors 403 and 404 shown in FIGURE 4A instead of capacitors, system hysteresis can be overcome, but the input sensitivity will be reduced. Thus, tunnel diode 102 can be biased at $I_p$ such that it switches at exactly 0 volt. However, the coupling resistor is large enough that tunnel diode 104 will not switch until the input current has increased beyond a given level. Similarly the negatively biased side will not switch the flip-flop until the signal has reached a certain negative signal. Therefore, the positive and negative crosses can be set exactly to zero but the circuit will not oscillate as the loop gain is not high enough. In other words, before switching, the circuit must receive a given magnitude of input. Here it will be seen that the system hysteresis is significant although the hysteresis of the switching tunnel diodes appear to be exactly zero.

It is to be understood, that the specific embodiments shown are not to be limitative of the invention. These embodiments are merely illustrative of the principle whereby a pair of tunnel diodes are utilized for switching in response to the level of the signal applied thereto and a further pair of tunnel diodes operate as a flip-flop and "store" the information applied thereto by the switching tunnel diodes. It is to be understood that any parameter values may be changed without altering the principle of operation of the circuit and that full allowance of equivalence is contemplated.

Having thus described the invention what is claimed is:

1. A circuit comprising; a plurality of tunnel diodes each of which has an anode and a cathode, each of said tunnel diodes being characterized by On and Off conditions which correspond to large and small current conducting conditions respectively, first and second tunnel diodes having the anodes thereof connected together, third and fourth tunnel diodes having the cathodes thereof connected together and to the anodes of said first and second tunnel diodes, separate bias means coupled to each of said tunnel diodes and operative to bias each tunnel diode for hi-staple operation, one of said second and third tunnel diodes being normally biased to the Off condition by the associated bias means, means for supplying input signals to said circuit via said first and fourth tunnel diodes, and means coupling said tunnel diodes together whereby the input signal may be selectively passed from tunnel diode to tunnel diode.

2. A level gating circuit comprising, a plurality of tunnel diodes, each of said tunnel diodes having two electrodes and exhibiting two different stable operating conditions, first and second tunnel diodes for providing output signals at one electrode thereof, first bias means coupled to said first and second tunnel diodes to determine the operating condition of said first and second tunnel diodes, input supplying means coupled to said first bias means and adapted to drive said first and second tunnel diodes, said first bias means being adapted to regulate the input level at which said first and second tunnel diodes switch from one operating condition to the other, third and fourth tunnel diodes, second bias means, said third and fourth tunnel diodes connected together by said second bias means to provide flip-flop action whereby said third and fourth tunnel diodes assume different operating conditions, and means coupling said first and second tunnel diodes to said third and fourth tunnel diodes whereby the output signals supplied by said first and second tunnel diodes may be stored by said third and fourth tunnel diodes.

3. A circuit comprising first and second tunnel diodes each of which is capable of providing output signals at one electrode thereof, bias means coupled to said first and second tunnel diodes to determine the operating condition thereof, means for supplying an alternating input signal being coupled to said bias means and adapted to drive said first and second tunnel diodes, said first and second tunnel diodes providing outputs at said one electrode thereof in accordance with the level of the input signal supplied thereto, third and fourth tunnel diodes for storing the information represented by the output levels at said first and second tunnel diodes, and means coupling all of said tunnel diodes together.

4. A circuit comprising; a plurality of tunnel diodes each of which operates in the bistable mode and exhibits Off and On operating conditions alternatively, first and second tunnel diodes having the anodes thereof connected together at a first common junction, third and fourth tunnel diodes having the cathodes thereof connected together at a second common junction, means connecting together said first and second common junctions, separate bias means coupled to each of said tunnel diodes to determine the operating condition and switching requirements thereof, one of said second and third diodes being normally biased to the Off condition by the associated bias means, means for supplying input signals of varying magnitude levels to said circuit via said first and fourth tunnel diodes, said first and fourth tunnel diodes being adapted to provide an output when said input signals attain a magnitude level determined by the associated bias means, and impedance coupling together the anodes and cathodes of said tunnel diodes which are not connected to one of said common junctions such that signals may be selectively passed from tunnel diode to tunnel diode.

5. In a level gating circuit, a first pair of bistable switching elements each having different switching levels, first impedance means for connecting together the bistable elements of said first pair of bistable elements, a second pair of bistable switching elements each having different switching levels, second impedance means for connecting together the bistable elements of said second pair of bistable elements, first bias means connected to said first pair of elements for regulating the switching levels thereof, second bias means connected to said second pair of elements for regulating the switching levels thereof, third impedance means for connecting together said first and second pairs of elements whereby signals may be transmitted therebetween, and means for applying input signals to said circuit via said first pair of bistable elements, said input signals having varying magnitude levels such that each of the bistable elements of said first pair of bistable elements switches only when said input signals exceed the associated switching level regulated by said first bias means.

6. In combination, means for applying repetitive input signals having positive and negative going transitions, a plurality of bistable switching elements exhibiting at least a high current conducting state, a first pair of said bistable switching elements connected to said means for applying input signals, one of said elements adapted to switch to the high current conducting state thereof with the positive going transition of said input signal and the other element adapted to switch to the high current conducting state thereof with the negative going transition of said input signal, a second pair of bistable switching elements, first bias means connected to said first pair of elements for regulating the switching level thereof, second bias means connected to said second pair of elements for regulating the switching level thereof, each of said pairs of elements adapted to have each of the elements thereof operating in different states, and means for connecting together said first and second pairs of elements such that each element of said first pair of elements supplies an input signal to a different element of said second pair of elements.

7. A circuit comprising; first and second tunnel diodes having the anodes thereof connected together, third and fourth tunnel diodes having the cathodes thereof connected together, said second and third tunnel diodes connected together as a mutally exclusively operable flip-flop network, separate bias means coupled to each of said tunnel diodes, each of said tunnel diodes being biased to operate in a bistable mode of operation and exhibiting On and Off conditions of operation, said first tunnel diode initially being biased in the Off condition, said fourth tunnel diode initially being biased in the On condition, said first and fourth tunnel diodes being biased to particular operating points within the operating conditions whereby said tunnel diodes selectively switch to the other operating condition when driven beyond said particular operating points, one of said second and third tunnel diodes being initially biased to the Off condition by the associated bias means and the other of said second and third tunnel diodes being initially biased to the On condition, means for supplying repetitive alternating input signals to said circuit via said first and fourth tunnel diodes whereby said first and fourth tunnel diodes can be selectively driven from one condition to the other, and impedance means coupling together the anodes and cathodes of said tunnel diodes which are not otherwise connected together whereby signal levels may be selectively passed thereby.

8. The circuit of claim 7, wherein the bias means connected to said first and fourth tunnel diodes is variable whereby the operating point in either operating condition is variably determinable.

References Cited by the Examiner

UNITED STATES PATENTS 2,924,725 2/60 Blair ------------------ 307—88.5

OTHER REFERENCES

IBM Technical Disclosure Bulletin, vol. 3, No. 9, February 1961, "Esaki Diode Binary Counter," A. J. Gruodis.

IBM Technical Disclosure Bulletin, vol 3, No. 10, March 1961, "Esaki Diode Circuitry," W. Mayeda.

ARTHUR GAUSS, *Primary Examiner.*

JOHN W. HUCKERT, GEORGE N. WESTBY, *Examiners.*